United States Patent [19]

Scharrer et al.

[11] Patent Number: 4,858,181
[45] Date of Patent: Aug. 15, 1989

[54] FAST RECOVERY PNP LOADED BIPOLAR STATIC RAM MEMORY CELL WITH AN INDEPENDENT CURRENT PATH

[75] Inventors: Carl J. Scharrer, Plano; Debbie S. Vogt, Dallas, both of Tex.

[73] Assignee: Texas Instruments Incorporated, Dallas, Tex.

[21] Appl. No.: 70,769

[22] Filed: Jul. 7, 1987

[51] Int. Cl.⁴ .................. G11C 11/00; G11C 11/34; G11C 13/00
[52] U.S. Cl. .................................. 365/155; 365/154; 365/177
[58] Field of Search ............... 365/154, 155, 156, 174, 365/179, 177

[56] References Cited

U.S. PATENT DOCUMENTS

| | | | |
|---|---|---|---|
| 4,387,445 | 6/1983 | Denis et al. | 365/156 |
| 4,480,319 | 10/1987 | Hotta et al. | 365/155 X |
| 4,618,944 | 10/1986 | Okajima | 365/189 X |
| 4,745,580 | 5/1988 | Laymoun et al. | 365/179 X |
| 4,754,430 | 6/1988 | Hobbs | 365/155 X |
| 4,769,785 | 9/1988 | Guo | 365/179 |

OTHER PUBLICATIONS

IBM Technical Disclosure Bulletin, vol. 26, No. 6, Nov. 1983, "Memory Cell with Minimized Negative Resistance Effects" M. J. Hargrove and C. J. Masenas.

Primary Examiner—James W. Moffitt
Assistant Examiner—Alfonso Garcia
Attorney, Agent, or Firm—Thomas R. FitzGerald; Leo N. Heiting; Melvin Sharp

[57] ABSTRACT

A semiconductor memory includes a memory cell (42) which utilizes a cross-coupled bipolar SCR latch. The latch includes two sense nodes (78) and (80). Sense node (78) has associated therewith an NPN transistor (82) and a PNP load transistor (84). Similarly, sense node (80) has associated therewith an NPN transistor (90) and a PNP load transistor (92) configured as an SCR. Each of these sense nodes is cross-coupled to the base of the NPN transistor connected to the opposite sense node. A forward biased PN junction is connected between an external Write circuit and the collector of each of the NPN transistors to provide an independent current path when changing from a low logic state to a high logic state. This decreases the recovery time when going from a saturated to a cut-off state for the NPN transistor. The PN junction can utilize either a forward bias collector of base junction of a PNP transistor or a series connected Schottky diode which has the cathode thereof connected to the sense node and the anode thereof connected to an external Write circuit. The memory cell is written to by providing a high voltage on one side of the PN junction and lowering the voltage on the emitters of the PNP load transistors such that current will flow through the PN junction.

14 Claims, 3 Drawing Sheets

FAST RECOVERY PNP LOADED BIPOLAR STATIC RAM MEMORY CELL WITH AN INDEPENDENT CURRENT PATH

TECHNICAL FIELD OF THE INVENTION

The present invention pertains in general to a memory cell in semiconductor memories and, more particularly, to a bipolar cross-coupled SCR memory cell.

BACKGROUND OF THE INVENTION

Semiconductor memory cells can generally be classified into two groups—high speed operation and large memory capacity. Attaining high speed operation usually incurs the use of bipolar devices which inevitably results in a large amount of power consumption. One example of a bipolar high speed memory is utilizing emitter coupled logic (ECL). It is difficult to obtain large memory capacity on a semiconductor chip utilizing bipolar techniques in the memory cell due to power consumption limitations. When design constraints require a large memory capacity, MOS devices are normally utilized for both the memory cell and the various peripheral circuits. However, MOS devices have a great deal of capacitance associated with the various nodes in addition to larger voltage swings than some bipolar technologies such as ECL. To attain this larger memory capacity with the use of MOS devices usually requires a sacrifice in the operating speed of the memory.

Bipolar transistors have been utilized in high speed semiconductor memories due to their low impedance characteristics which allows them to operate at the higher speeds. Typically, a memory cell for a high speed bipolar memory utilizes cross-coupled NPN transistors with PNP load transistors. This is conventionally termed a "cross-coupled SCR" memory cell. This configuration has provided the optimum performance choice for a number of years. The use of the PNP load provides both a smaller cell layout and a higher noise margin than other bipolar configurations. The larger noise margin is due to the gain of the PNP load. However, one disadvantage of this device is that both the NPN and PNP devices are in hard saturation, resulting in a slow reverse recovery time when turning off. This directly increases the write recovery time.

Attempts to improve the write recovery time have utilized techniques to reduce the lifetimes of holes injected into the epitaxial layer of the transistors. However, these techniques have been unsatisfactory in that they result in a larger cell area with the requirement of additional implants and circuit adjustments to maintain temperature tracking. Therefore, a need exists to reduce the recovery time of the NPN transistors in the SCR cross-coupled latch without substantially increasing the cell size or incurring any temperature tracking problems.

SUMMARY OF THE INVENTION

The present invention disclosed and claimed herein comprises a cross-coupled SCR memory cell for storing first and second logic states on first and second sense nodes associated with the cross-coupled SCRs. The SCRs are disposed between a reference word line voltage and a current source. The sense nodes are selectively interfaced with an external reference voltage through a current path to allow current to flow to the sense node when the SCR is making a transition from a saturated to a nonsaturated state. The current path is activated in response to the presence of data requiring the change of the logic state in the memory cell. Read circuitry is provided for sensing the logic state in the memory cell.

In one embodiment of the present invention, the current path is comprised of a PN junction connected between an associated column line and one of the sense nodes. The PN junction is selectively forward biased by connecting it to the external voltage to provide current therefor. The PN junction can either comprise a series connected Schottky diode or the collector-base junction of a PNP transistor which is connected between a Word Line voltage and the sense node.

A technical advantage is provided by the present invention in that the current path provided for interfacing the sense node to an external supply provides an independent current path to the collector of the NPN transistor in the SCR when recovering from the saturated state. This independent current path overcomes the normally low gain PNP load transistor which heretofor has supplied the current for the associated NPN transistor. A further technical advantage is provided in that a PN junction can be fabricated in the form of a Schottky diode or a secondary collector on the PNP load transistor. This requires only a minimal increase in the cell size and a substantial decrease in recovery time when writing to the memory cell.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
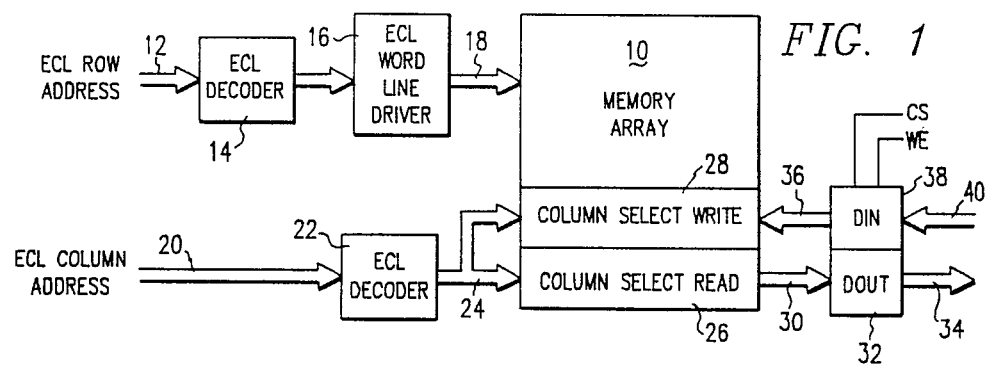
FIG. 1 illustrates a schematic block diagram of a semiconductor memory utilizing the memory cell of the present invention.

Referring now to FIG. 1, there is illustrated a schematic block diagram of a semiconductor memory utilizing the memory cell of the present invention. A plurality of memory cells are arranged in a memory array 10 with the cells arranged in rows and columns. A row address is received on an input row address bus 12 which is input to an ECL row decoder 14 and then input to an ECL Word Line driver 16. The decoder 14 outputs a row select signal for each row in the memory array 10 with only one row selected at any given time; i.e., the decoder 14 has a mutually exclusive output. The Word Line driver 16 provides one drive output for each row line which is connected to the row lines through a word line input bus 18.

In a similar manner, a column address is received on a column address bus 20 for input to an ECL decoder 22. The ECL decoder 22 is output on a bus 24 to both a column select read circuit 26 and a column select write circuit 28. The column select read circuit 26 is operable to interface with the columns of memory array 10 to access information in the cell associated with the selected row. The accessed information is output on a bus 30 for input to a data output buffer 32 which drives an output bus 34. The column select write circuit 28 receives input data from a bus 36 which is interfaced with a data input buffer 38 for receiving information from a data input bus 40. The data input buffer 38 is interfaced with the Chip Select signal (CS) and a Write Enable signal (WE) such that information can be written to the memory array 10 only when both the CS and WE signals are present.

Figure 2:
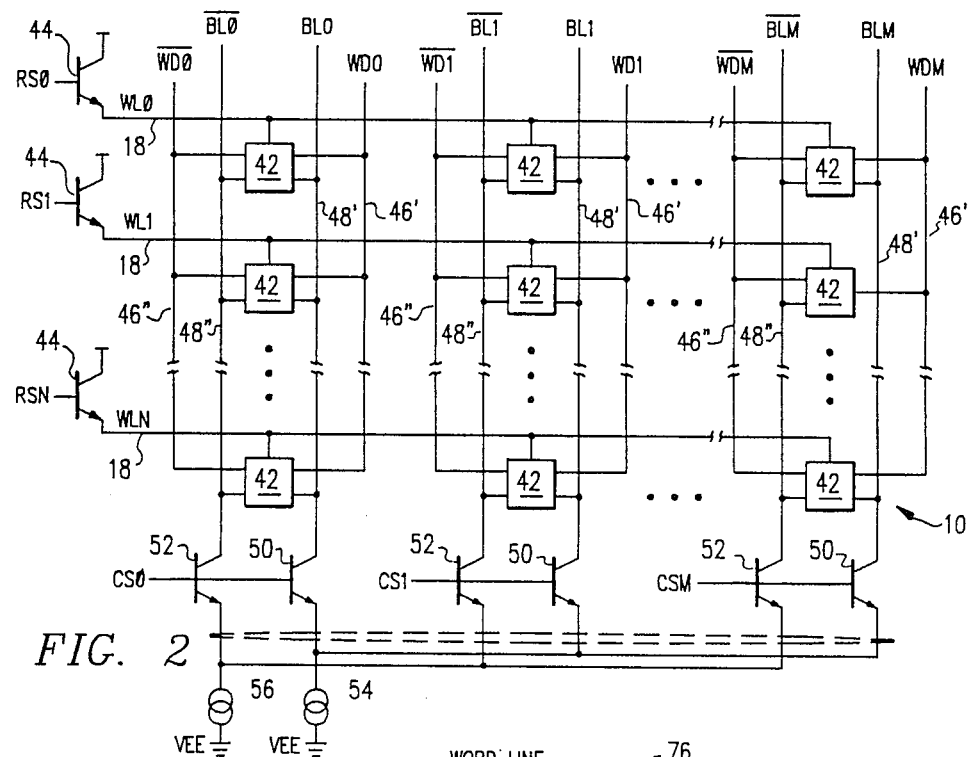
FIG. 2 illustrates a schematic block diagram of the memory array utilizing the memory cell of the present invention.

Referring now to FIG. 2, there is illustrated a schematic diagram of the memory array 10. The memory array 10, as described above, is comprised of a plurality of memory cells 42 that are arranged in rows and columns. Each cell 42 in each row is interfaced with one of the Word Lines 18 with each Word Line 18 being driven by an NPN transistor 44. Each of the NPN transistors 44 has the emitter thereof connected to the associated Word Line 18, the collector thereof connected to $V_{CC}$ and the base thereof connected to one of the row select signals RS0–RSN.

Each of the memory cells 42 is interfaced with two Write Data lines 46' and 46" and also with two Bit lines 48' and 48". Each of the Write Data lines 46' are labeled WD0–WDM and each of the Write Data lines 46" is labeled with the corresponding inverted form thereof such that the Write data lines 46' and 46" represent the noninverted and inverted data, respectively. In a similar manner, each of the bit lines 48' is labeled BL0–BLM and the bit lines 46' are labeled with the corresponding inverted forms thereof.

Each of the bit lines 48' and 48" is selected by column select transistors 50 and 52, respectively. Each of the column select transistors is comprised of an NPN transistor having the collector thereof connected to the corresponding one with the bit lines 48' or 48", the collector thereof connected to one of the column select signals CS0–CSM and the emitter thereof connected to one of two current sources 54 and 56 with the emitters of each of the transistors 50 connected to the current source 54 and the emitters of each of the transistors 52 connected to current source 56. Current sources 54 and 56 are operable in the sensing operation as will be described herein below.

Figure 3:
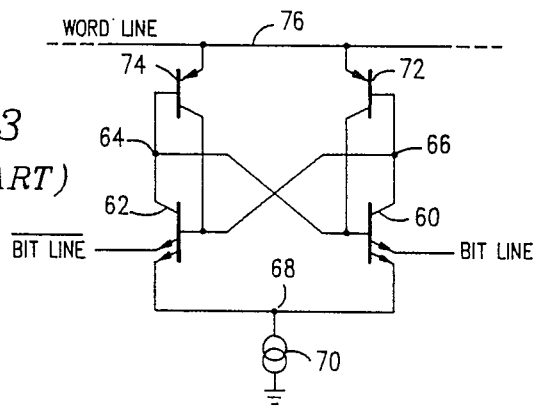
FIG. 3 illustrates a schematic diagram of a prior art memory cell utilizing a cross-coupled SCR.

Referring now to FIG. 3 there is illustrated a schematic diagram of a prior art memory cell utilizing NPN transistors in a cross coupled configuration with PNP transistor loads. Two NPN transistors 60 and 62 are provided with transistor 60 having the base thereof connected to the collector of transistor 62, which collector comprises a storage node 64, and the base of transistor 62 being connected to the collector of transistor 60, which collector comprises a storage node 66. Transistors 60 and 62 are multi-emitter transistors with one emitter of both transistors 60 and 62 being connected to a holding current node 68 that is connected through a current source 70 to $V_{EE}$. PNP transistors 72 and 74 are provided as load transistors for NPN transistors 60 and 62, respectively. PNP transistor 72 has the base thereof connected to storage node 66, the collector thereof connected to the base of transistor 60 and the emitter thereof connected to a Word Line 76. PNP transistor 74 has the base thereof connected to storage node 64, the collector thereof connected to the base of transistor 62 and the emitter thereof connected to Word Line 76.

In operation, the prior art memory cell of FIG. 3 is operable to store a logic state on the storage nodes 64 and 66 with one of the nodes 64 and 66 being high and the other being low. If, for example, node 64 is to be high and node 66 is to be low, this would result in NPN transistor 62 being turned off and PNP transistor 72 being turned on. PNP transistor 72 will pull node 64 high, turning off PNP transistor 74 and inhibiting base current from flowing to transistor 62, thus rendering transistor 62 nonconductive. Similarly, transistor 60 is conductive supplying current through the emitter thereof to the holding current node 68 and through current source 70.

Once the logic states have been determined in the memory cell, it is only necessary then to draw a predetermined amount of current through NPN transistor 60 to maintain storage node 66 at a low state. This is termed the "holding current" of the memory cell. With the use of the PNP loads, this holding current is reduced to the minimum due to the gain product of both the PNP and NPN transistors. The holding current can be on the order of a few microamps.

In order to change the logic states of the memory cell, it is necessary to override the holding current of current source 70 by drawing additional current through the second emitter of one of the transistors 60 or 62 associated with the high side. In the above example, this would be transistor 62. In the example of FIG. 3, the secondary emitter of NPN transistor 62 is connected to the inverted bit line and the secondary emitter of NPN transistor 60 is connected to the noninverted bit line.

When current is drawn through the secondary emitter of transistor 62, transistor 62 turns on to pull the storage node 64 down and also turn on transistor 74. Transistor 74 then pulls storage node 66 high, turning off transistor 72 and NPN transistor 60. However, NPN transistor 60 and PNP transistor 72 are in full saturation in the prior state, i.e., with node 66 low. Therefore, there is approximately 200 mv across the collector-emitter of the transistors 60 and 72 when in saturation. Since there is approximately one diode drop across the base to the emitter, this results in the collector being at a lower voltage than the base, i.e., forward biased. This creates a large collector depletion-layer with an associated capacitance due to the injection of holes, which results in an increased capacitance on the low side storage node. This capacitance effectively increases the write recovery time since the opposite side PNP load must pull up the storage node or discharge the collector depletion-layer capacitance formed in the saturated device before the cell is stabilized. The write recovery time of the cross coupled SCR memory cell is one disadvantage of the prior art cell of FIG. 3.

Figure 4:
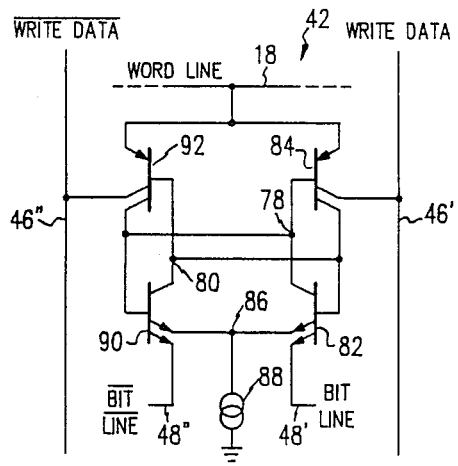
FIG. 4 illustrates a schematic diagram of the memory cell of the present invention.

Referring now to FIG. 4, there is illustrated a detailed schematic diagram of the memory cell of the present invention, wherein like numerals refer to like parts in the two Figures. Each of the memory cells 42 is comprised of two cross-coupled SCR's, one connected to a sense node 78 and one connected to a sense node 80. Sense node 78 has associated therewith a multi-emitter NPN transistor 82 and a multi-collector PNP load transistor 84. Transistor 82 has the collector thereof connected to the sense node 78, the base thereof connected to both the sense node 80 and one collector of the multi-collector PNP transistor 84 and one of the emitters connected to a stand-by current node 86. Stand-by current node 86 is connected to one side of a current source 88 which has the emitter thereof connected to $V_{EE}$. The PNP transistor 84 has the emitter thereof connected to Word Line 18, the base thereof connected to sense node 78 and the other collector thereof connected to the Write Data line 46'.

In a similar manner, the SCR is comprised of a multi-emitter NPN transistor 90 and a multi-collector PNP transistor 92. NPN transistor 90 has the collector thereof connected to both the sense node 80 and the base of PNP transistor 92, the base thereof connected to both the sense nodes 78 and one collector of the PNP transistor 92, and one emitter thereof connected to the stand-by current node 86. The PNP transistor 92 has the other collector thereof connected to the inverted Write Data line 46'. The NPN transistor 82 has the other emitter thereof connected to the Bit line 48' and the NPN transistor 90 has the emitter thereof connected to the inverted Bit line 48'.

In operation, the memory cell 42 of FIG. 4 operates in the static mode in a similar manner to the operation of the prior art memory cell of FIG. 3; that is, the SCR connected to the logic "1" side of the memory cell is saturated with the other being unsaturated. It is therefore necessary to go from a saturated state to an unsaturated state when changing the logic state of a memory cell. In order to improve Write recovery time, data is written to the memory cell through the secondary collector of the PNP load transistor 84 or 92 by forward biasing the collector-base PN diode junction. This merely requires a voltage on the Write data lines 46' or 46" that is higher than the voltage on the sense node connected to the base of the associated PNP transistor 84 or 92. One of the problems of the prior art memory cell is that the PNP load transistor, which typically has a low beta or gain, results in a slow recovery time. By providing an independent current path to the low side sense node associated with the collector of the saturated NPN transistor, a current path is provided to aid in the transition of the PNP transistor from the saturated to the active state followed by a transistor from the active to cut cut-off state. This significantly enhances the Write recovery time of the cell without significantly increasing the area of the cell since only a secondary emitter is required on the already fabricated PNP load transistor 84 or 92.

Figure 5:
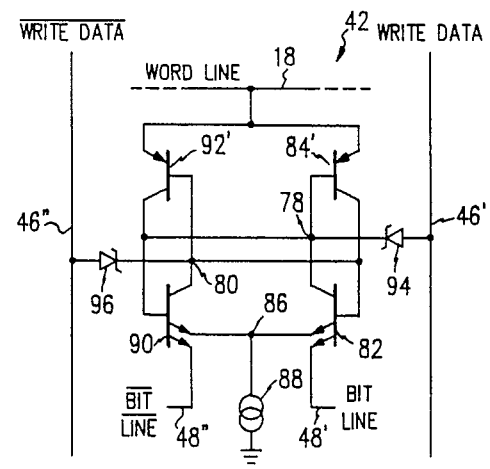
FIG. 5 illustrates an alternate embodiment of the memory cell of FIG. 4.

Referring now to FIG. 5, there is illustrated an alternate embodiment of the memory cell 42 of the present invention, wherein like numerals refer to like parts in the various Figures. In the memory cell 42 of FIG. 5, the multi-collector PNP load transistors 84 and 92 are replaced by standard PNP load transistors 84' and 92', respectively. The sense node 78 is connected to the Write Data line 46' through a Schottky diode 94 which has the cathode thereof connected to the sense node 78 and the anode connected to the Write Data line 46'. In a similar manner, the sense node 80 is connected to the inverted Write Data line 46" through a Schottky diode 96 which has the cathode thereof connected to the sense node 80 and the anode thereof connected to the inverted Write Data line 46". The Schottky diodes g4 and 96 perform the same function as the forward biased collector-base junctions of the multi-collector PNP load transistors 84 and 92 of FIG. 4, that is, they provide a path from the Write data lines 46' or 46" to the respective sense nodes 78 or 80. This allows current to be transferred from the respective Write Data line 46' or 46" to the collectors of the saturated NPN transistors 82 or 90. The Schottky diodes 4 and g6 perform essentially the same function and are easily implemented into the structure of the memory cell with conventional techniques.

Figure 6:
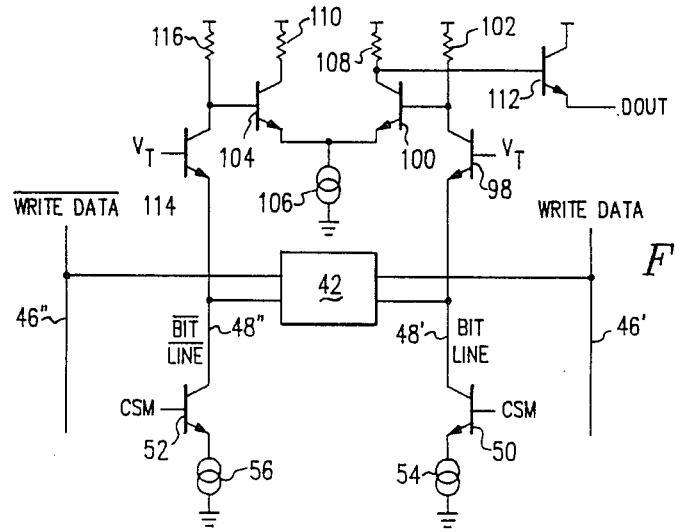
FIG. 6 illustrates a schematic block diagram of the read circuitry for accessing data in the memory cell.

Referring now to FIG. 6, there is illustrated a schematic block diagram of one memory cell 42 illustrating the sense amp circuitry for reading the data accessed on the Bit line 48' and inverted Bit line 48" wherein like numerals refer to like parts in the various Figures. The bit line 4B' has one end thereof connected to the collector of the column select transistor 50, as described above, and the other end thereof connected to the emitter of an NPN transistor 98. Transistor 98 has the base thereof connected to a threshold voltage $V_T$ and the collector thereof connected to the base of an NPN transistor 100. The collector of transistor 98 is also connected to $V_{CC}$ through a resistor 102. NPN transistor 100 is one part of a differential pair, the other part being an NPN transistor 104. NPN transistor 104 has the emitter thereof connected to the current source 106, and current source 106 is connected to $V_{EE}$. NPN transistors 100 and 104 also have the collectors thereof connected to $V_{CC}$ through resistors 108 and 110, respectively. The collector of NPN transistor 100 is connected to the base of an emitter follower transistor 112, the collector of which is connected to $V_{CC}$ and the emitter of which is connected to the DOUT terminal. Transistor 112 comprises the output device in the circuit. The NPN transistor 114 is connected similarly to the NPN transistor 100 in that the base thereof is connected to the collector of a reference NPN transistor 114. Transistor 114 has the base thereof connected to the reference voltage $V_T$ and the emitter thereof connected to the inverted Bit line 48". The collector of transistor 114 is connected to $V_{CC}$ through a resistor 116.

In operation, each of the Bit lines 48' and 48" is connected to the emitter of one of the NPN transistors 82 or 90 in the memory cells such that the reference transistors 100 and 114 comprise one part of a differential pair. For example, if the associated NPN transistor 82 or 90 has the base thereof connected to a high sense node such that it is turned on, current will be drawn through the NPN transistor in the memory cell and provided to the associated Bit line 48' or 48", thus providing current to the associated current source 54 or 56. This will raise the voltage from the Bit line above the reference voltage $V_T$, thus turning off either the reference transistor 98 or the reference transistor 114. When one of the respective transistors 98 or 114 is turned off, the associated resistor 102 or 116 will pull the base of the associated differential transistor 100 or 104 high, thus turning it on. This will be reflected in the voltage on the output of the NPN emitter follower transistor 112.

Figure 7:
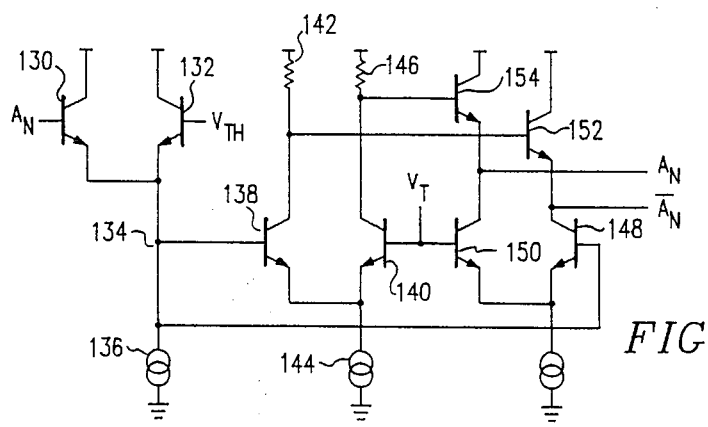
FIG. 7 illustrates a schematic diagram of an address buffer.

Referring now to FIG. 7, there is illustrated a schematic diagram of an input ECL buffer for receiving one of the address lines $A_N$ for the row or the column address. The address signal $A_N$ is input to one input of an ECL gate which is comprised of two NPN bipolar transistors 130 and 132 with the base of transistor 130 connected to the signal line $A_N$ and the base of transistor 132 connected to a threshold voltage $V_{TH}$. The collectors of transistors 130 and 132 are connected to $V_{CC}$ and the emitters thereof are connected to a node 134. Node 134 is connected to a current source 136 to provide current for the input gate.

Node 134 is input to a second ECL gate which is comprised of two NPN transistors 138 and 140, the base of transistor 138 is connected to node 134 and the base of transistor 140 is connected to a threshold voltage $V_T$. The collector of transistor 130 is connected to $V_{CC}$ through a resistor 142 and the base thereof connected to a current source 144. Transistor 140 has the collector thereof connected to $V_{CC}$ through a resistor 146 and the emitter thereof connected to current source 144.

Node 134 is also connected to a third ECL gate which is comprised of two NPN transistors 148 and 150, the base of transistor 14B connected to node 134 and the base of transistor 150 connected to threshold voltage $V_T$. The collector of transistor 148 is connected through the emitter-collector path of an NPN transistor 152 to $V_{CC}$, and the collector of transistor 150 is connected through the emitter-collector path of an NPN transistor 154 to Transistor 152 has the base thereof connected to the $V_{CC}$. collector of transistor 138 and the transistor 154 has the base thereof connected to the collector of transistor 140. The collector of transistor 150 comprises the noninverted address signal $A_N$ and the collector of transistor 148 comprises the inverted form of the address signal $A_N$.

Figure 8:
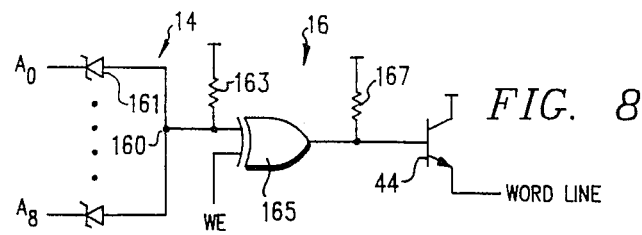
FIG. 8 illustrates a schematic diagram of the decoder and Word Line driver.

Referring now to FIG. 8, there is illustrated a schematic diagram of the Word Line driver 16 and row decoder 14 of FIG. 1. The row decoder is comprised of a plurality of Schottky diodes 161 connected between select ones of the inverted or noninverted buffered address input lines and a row select node 160. The individual diodes are each connected between the node 160 and a select one of the buffered row address lines $A_0$ through $A_8$ or the inverted forms thereof. The anode of each of the diodes is connected to the row select node 160 with the cathode thereof connected to the individual row address lines. The row select node 160 is connected to $V_{CC}$ through a resistor 163.

When any of the row select lines associated with a particular Word Line driver for a given Word Line is a low, this will result in node 160 being pulled low through the associated diode 161. However, when all of the associated row address lines or inverted forms thereof are high, row select node 160 will be pulled high through resistor 163. This will provide the decode function for a particular Word Line. Of course, it should be understood that each Word Line has a particular coding provided by the particular ones of the row address lines or inverted forms thereof that are associated with the Word Line.

The row select node 160 is connected to one input of an Exclusive OR gate 165. The Exclusive OR gate 165 has the other input connected to the Write Enable input WE. In the read mode, the Exclusive OR gate 165 outputs a high signal when the Write Enable signal is low and the row select node 160 is high. Therefore, only the Exclusive OR gate 165 associated with the selected row will have a high output with the remaining rows having a low output on the associated Exclusive OR gate 165. This is what is termed an "active high" Read operation. In the Write mode, on the other hand, when Write Enable is high on the other input of the Exclusive OR gate 165, the output of Exclusive OR gate 165 is low when node 160 is high for a selected row and all the remaining Exclusive OR gates 165 output a high signal. Therefore, for the selected row in a Write operation, the associated Exclusive OR gate 165 has a low on the output thereof. This is termed an "active low" Write operation. The output of each Exclusive OR gate 165 for each of the Word Lines is connected to the input of the row line driver transistor 44 and also to $V_{CC}$ through a pull up resistor 167.

Figure 9:
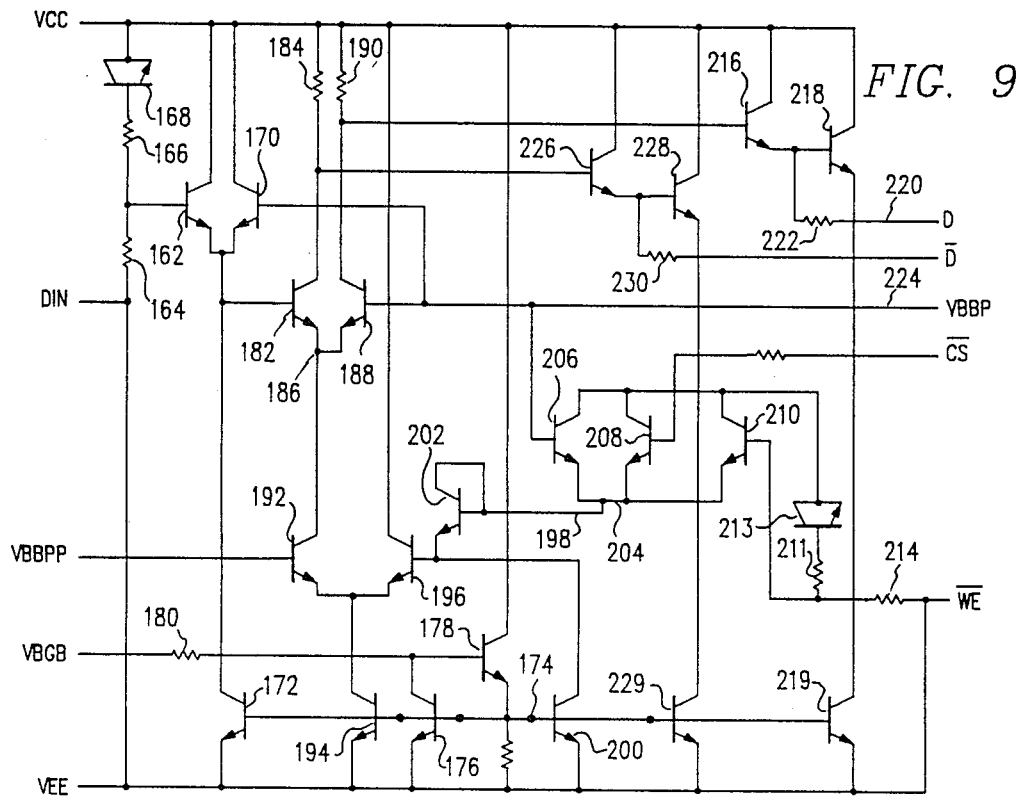
FIG. 9 illustrates a schematic diagram of the Data In buffer.

Referring now to FIG. 9, there is illustrated a schematic diagram of the Write Enable circuit for providing noninverted and inverted forms of the data. The data is input to the base of an NPN transistor 162 through a series resistor 164. The base of transistor 162 is also connected to $V_{CC}$ through a series resistor 166 and diode configured transistor 168. Transistor 168 has the emitter and collector tied together to $V_{CC}$ to provide the diode configuration. Transistor 162 forms one side of a differential ECL amplifier with the other side formed by an NPN transistor 170, the base of which is connected to a reference voltage VBBP, the collector of which is connected to $V_{CC}$ and the emitter of which is connected to the emitter of transistor 162. Transistor 162 also has the collector thereof connected to $V_{CC}$. The emitter of transistors 162 and 170 are connected to the collector of an NPN transistor 172, the emitter of which is connected to $V_{EE}$ with transistor 172 functioning as a current source. The base of transistor 172 is connected to a node 174. Node 174 is connected to the base of transistor 176, the emitter of which is connected to $V_{EE}$ and the collector of which is connected to the base of a transistor 178. Transistor 17B has the emitter thereof connected to node 174 and the collector thereof connected to $V_{CC}$. The base of transistor 178 is also connected through a resistor 180 to a reference voltage VBGB which is offset from $V_{EE}$. Transistors 176 and 178 provide a current reference to the base of transistor 172, thus forming a current source.

The output of the differential amplifiers formed by transistors 162 and 170 is generated at the junction of the emitters thereof and is input to a second differential amplifier to the base of an NPN transistor 182. The collector of transistor 182 is connected to $V_{CC}$ through a resistor 184 and the emitter thereof connected to a node 186. Transistor 182 forms one side of the differential amplifier with the other side being formed by an NPN transistor 188 which has the base thereof connected to the reference voltage VBBP, the collector thereof connected to $V_{CC}$ through a resistor 190 and the emitter thereof connected to node 186. The node 186 is connected to the collector of an NPN transistor 192, the base of which is connected to a reference voltage VBBPP and the emitter of which is connected to the collector of a current source transistor 194, transistor 194 having the base thereof connected to node 174 and the emitter thereof connected to $V_{EE}$. Transistor 192 forms one side of a differential amplifier with the other side formed by NPN transistor 196, the base of which is connected to a node 198 and the collector of which is connected to $V_{CC}$. Node 198 is connected to a current source transistor 200, the base of which is connected to node 174 and the emitter of which is connected to $V_{EE}$. Additionally, node 198 is connected to the emitter of a transistor 202, the base and collector of which are connected to a node 204. Node 204 is connected to the emitters of NPN transistors 206, 208 and 210. The base of transistor 210 is connected to $V_{CC}$ through a series resistor 211 and diode configured transistor 213. Transistor 206 has the base thereof connected to voltage VBBP, the collector thereof connected to $V_{CC}$ and the base thereof connected to an inverted Chip Select signal (CS) through a resistor 212. Transistor 210 has the collector connected thereto to $V_{CC}$ and the base thereof connected to the inverted form of the Write Enable signal WE through a resistor 214.

The gate formed by transistors 182 and 188 provides the output data. The noninverted form of the data D is output from the collector of transistor 188 to the base of an NPN transistor 216, the collector of which is connected to $V_{CC}$ and the emitter of which is connected to the base of an NPN transistor 218. Transistor 218 has the collector thereof connected to $V_{CC}$ and the emitter thereof connected to an output pad 220, which comprises the noninverted form of data D. The emitter of transistor 218 is also connected to a current source transistor 219 configured similar to transistor 200. A resistor 222 is connected between the base and emitter of transistor 218. In a similar manner, the inverted form of the data D is provided on the collector of the transistor 182 and is connected through an output circuit to output line 224, output line 224 providing the inverted form of the data D. The output circuit is comprised of two transistors 226 and 228 which are similar in function to transistors 216 and 218, respectively, with a current source transistor 229 configured similar to transistor 219. A resistor 230 is provided which functions similar to resistor 222.

In operation, a high data input level turns on transistor 162 which conducts to provide current to current source transistor 172 which also turns on transistor 182 and, if transistor 192 is conducting, conducts current to current source transistor 194. This lowers the voltage on the collector of transistor 182 by the voltage drop across resistor 184. Transistors 226 and 22B are two series connected emitter followers which result in the voltage on the output line 224 being $2V_D$ below the voltage on the collector of transistor 182 which, as described above, is equal to the voltage drop across resistor 184. With the same high logic state for the input signal DIN, the transistor 188 in the second gate will be turned off, pulling the base of transistor 216 to $V_{CC}$, resulting in a drop of $2V_D$ across transistors 216 and 218 on the output pad 220 for the noninverted form of the output data D.

In the opposite low logic state, the voltage on DIN is lowered below the reference voltage VBBP such that it turns off transistor 162 and turns on transistor 170. This results in the voltage in the base of transistor 170 being $VBBP-V_D$ which turns off transistor 182 and turns on transistor 188. This results in transistor 188 conducting, assuming transistor 192 conducts, and creates a voltage drop across resistor 190. An additional voltage drop of up to $V_D$ is provided across transistors 216 and 218 on output terminal 220, resulting in a voltage of $V_{CC}-2V_D$ minus the voltage drop across resistor 190 which is approximately $V_D$. The voltage on output line 224 is $V_{CC}-2V_D$. Therefore, its voltage varies between approximately $V_{CC}-2V_D$ to $V_{CC}-3V_D$. For simplicity purposes, the description of the Write operation described hereinabove utilizes voltage variations of $V_{CC}-V_D$ to $V_{CC}-2V_D$.

If transistor 192 is nonconducting, the collector of both transistors 182 and 188 will be at $V_{CC}$ such that the voltage on both terminals 220 and 224 will be $V_{CC}-2VD$. This represents the high logic state on both terminals. In order to turn transistor 192 on, transistor 196 must be turned off by sourcing current from node 198 through current source transistor 200 to $V_{EE}$. This is controlled by the inverted form of the Write Enable signal; that is, the circuit will be enabled to write data when the Write Enable signal is in the low logic state and will be inhibited from writing when the Write Enable signal is in the high logic state. Therefore, for a Write operation, the inverted form of the Write Enable signal will be low and for a nonwrite operation, the inverted form of the Write Enable signal will be high. In the nonwrite operation, transistor 210 is turned on which raises the base of transistor 196 above VBBPP, which is the reference voltage on the base of transistor 192. In a similar manner, if the inverted form of the Chip Select signal is high, transistor 208 will be turned on, which also turns on transistor 196.

For the Write operation, the inverted form of the Write Enable signal is low, turning off transistor 210 to allow transistor 206 to turn on. The voltage on node 198 will then be the $VBBP-2V_D$ which is less than VBBPP, such that transistor 192 will then conduct and transistor 196 will be turned off.

Figure 10:
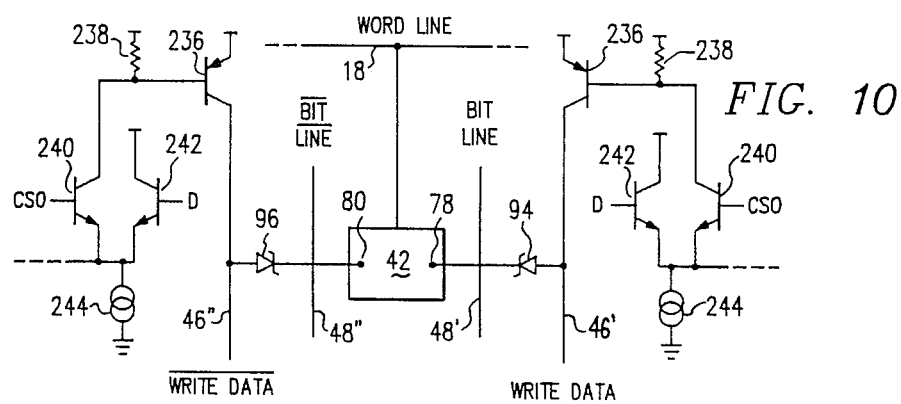
FIG. 10 illustrates a schematic diagram of the Write circuitry for interfacing with the Data In buffer.

Referring now to FIG. 10, there is illustrated a schematic block diagram of one of the memory cells 42 illustrating the Write operation. For illustrative purposes, the memory cell of FIG. 5 utilizing the Schottky diodes 94 and 96 is utilized. Each of the Write data lines 46' and 46" is connected to the collector of a PNP transistor 236. Each transistor 236 has the collector thereof connected to $V_{CC}$ and the base thereof connected to $V_{CC}$ through resistor 238. The base of each transistor 236 is also connected to the collector of an NPN transistor 240. Transistor 240 is one half of a differential pair, the other half comprising an NPN transistor 242. Transistor 242 has the collector thereof connected to $V_{CC}$ and the base thereof connected to either the inverted or the noninverted form of the data output by the circuit of FIG. 9 which represents the data, and the transistor 240 has the base thereof connected to one of the column select lines. The emitters of transistors 240 and 242 are connected to a current source 244.

For each bit of data, there is a predetermined number of cells in a selected row which can have written thereto the single bit of data that is input to the transistor 242 associated with the particular cell. Since this bit of data will only be written to one cell at a time, there is a column select transistor 440 and a PNP transistor 236 connected to the current source 244 associated with that particular bit of data. Therefore, if the memory array 10 were arranged in a "By-one" configuration, there would be a column select transistor 240 connected to the current source 244 for each column of memory cells with a PNP transistor 236 interfaced with each of the Write Data lines for each of the memory cells 42. However, if the memory array were arranged, for example, in a "By-eight" configuration, this would require eight NPN transistors 242, one for each bit, and an associated current source 244. Each column select line would select eight columns at a time, one associated for each bit. This would require a separate column select transistor 240 for each column select input.

In the Write operation, it is necessary, as described above, for the Word Line to be low. Since only one row can be written at a time, the remaining Word Lines for the nonselected rows are maintained at a high voltage or $V_{CC}$. When the Word Line is disposed at the lower voltage or $V_{CC}-2V_D$ and the PNP transistor 236 conducts, current will flow through Schottky diode 94 or 96 to the appropriate sense node. For example, if sense node 78 is at a low logic state, it is necessary to turn on PNP transistor 236 associated with a Write data line 46' and turn off PNP transistor 236 associated with Write data line 46" to raise it to a high logic state. This requires the presence of a low signal level for the noninverted form of the data on the base of transistor 242 associated with the Write data line 46' and selection of the associated column select transistor 240 by, for example, CS0. This will pull current through the emitter-base of PNP transistor 236, thus turning transistor 236 on and allowing current to be conducted through the collector-base junction thereof to diode 94. This will supply current to sense node 78. It should be noted that no current source is attached to the Write data line 46' or 46". Concurrently, the transistor 236 associated with the Write data line 46" is turned off since the data input to transistor 242 associated therewith is at a high signal level, thus turning off the associated transistor 240 and preventing conduction through transistor 236 and preventing current from flowing through diode 96 to sense node 80, if the sense node is at a low logic state.

In summary, there is provided a semiconductor memory utilizing a memory cell which provides for improved Write recovery operation. The memory cell utilizes a conventional cross-coupled bipolar SCR latch which stores information on two sense nodes. In a Write operation, current is provided through a forward biased PN junction such as the collector-base of a PNP load transistor or through a separate Schottky diode, to pull the NPN transistor out of saturation at a faster rate. The additional PN junction provides a separate and independent current path than that provided by the conventional PNP load.

Although the preferred embodiment has been described in detail, it should be understood that various changes, substitutions and alterations can be made therein without departing from the spirit and scope of the invention as defined by the appended claims.

What is claimed is:

1. A high speed bipolar memory cell for being interfaced with bit lines having data associated therewith for reading data from the bit lines and writing data thereto, comprising:
    a first pair of transistors comprising an NPN driver transistor and a PNP load transistor for driving a first sense node;
    a second pair of transistors comprising an NPN driver transistor and a PNP load transistor for driving a second sense node;
    said first and second pairs connected between a first reference voltage and a holding current node, said holding current node interfaced with an external current source for drawing current through said first and second pairs from said reference voltage;
    said second pair cross-coupled to said first pair to provide a cross-coupled latch having at least one saturated PNP load transistor;
    a read interface circuit for selectively coupling said first and second sense nodes with the bit lines for a read operation; and
    a write interface circuit for selectively coupling one of the bit lines to said saturated PNP load transistor.

2. The memory cell of claim 1 wherein:
    said associated NPN transistor has the emitter thereof connected to said holding current node, the base thereof connected to the opposite of said first and second sense nodes and the collector thereof connected to the associated one of said first and second sense nodes; and
    said associated PNP transistor has the emitter thereof connected to said reference voltage, the base thereof connected to the associated one of said first and second sense nodes and the collector thereof connected to the base of said associated NPN transistor.

3. The memory cell of claim 1 wherein said read interface circuitry comprises a secondary emitter associated with each of said NPN transistors for being interfaced with one of the bit lines to provide a base-emitter junction to allow sensing of the logic state of the memory cell.

4. The memory cell of claim 1 wherein said read interface circuitry comprises a PN junction connected between the bit lines and a select one of said first and second sense nodes for being forward biased when the select one of said sense nodes is at a voltage lower than the bit line to forward bias said PN junction to provide a current path.

5. The memory cell of claim 4 wherein said PN junction comprises a Schottky diode.

6. The memory cell of claim 4 wherein said PN junction comprises a secondary collector integrated into each of said PNP transistors with said PN junction formed across the collector base of said secondary collector and the base of said associated one of said PNP transistors.

7. A high speed bipolar memory for being interfaced with bit lines for reading data thereto and writing data therefrom comprising:
    first and second sense nodes;
    first and second NPN bipolar transistors each associated with one of said first and second sense nodes and having the collector thereof connected to the associated one of said sense nodes and the base thereof connected to the other of said sense nodes;
    a current source connected between the emitters of said first and second NPN transistors and a first reference voltage;
    first and second PNP load transistors associated with said first and second sense nodes, respectively, and connected between the associated one of said sense nodes and a second reference voltage higher than said first reference voltage with each of said PNP transistors having the base thereof connected to said associated sense node, the collector thereof connected to the opposite one of said sense nodes and the emitter thereof connected to said second reference voltage;
    write means associated with one of said first and second sense nodes for interfacing the associated one of said first and second sense nodes with the bit lines and selectively providing a current path from an external reference supply to said associated sense node in response to data on the interfaced bit line to change the logic state of the memory cell by injecting current into the collector of the PNP transistor associated with the sense node to aid in pulling the associated sense node from a lower voltage to a higher voltage; and read means for interfacing a selected one of said first and second sense nodes with the bit lines to enable sensing of the logic state in the memory cell.

8. The memory cell of claim 7 wherein said write means comprises a PN junction disposed between the interfaced bit line and said associated sense node and means for forward biasing the PN junction to provide current therethrough to said associated sense node from said external reference voltage in response to the presence of data on the bit line requiring a change in the logic state of the memory cell.

9. The memory cell of claim 7 wherein said write means comprises a Schottky diode disposed between said associated sense node and the bit line and means for selectively connecting a reference voltage to said bit lines to selectively forward bias said Schottky diode in response to the presence of write data requiring a change in the logic state of the memory cell.

10. The memory cell of claim 7 wherein said write means comprises a secondary collector integrated into said PNP load transistor associated with the one of said sense nodes associated with said write means to provide a PN junction, said secondary emitter interfaced with said bit lines, and means for connecting an external reference voltage to said bit lines to forward bias the PN junction provided by said secondary collector in response to the presence of data to be written to the cell.

11. A high speed memory cell comprising:
first and second sense nodes;
a first reference voltage node for being disposed at a first predetermined reference voltage;
a holding current node for providing a current sink;
first and second cross-coupled pairs of PNP and NPN transistors associated with said first and second sense nodes respectively, and disposed between said first reference voltage node and said holding current node, said first and second cross-coupled transistor pairs each operating in a saturated or a nonsaturated state and opposite each other, said saturated and nonsaturated states corresponding to a high or low logic state, respectively;
write circuitry for selectively providing an independent current path from an external reference voltage to said first and second sense node to change the state of the associated one of said first and second pairs from a saturated to a nonsaturated state when externally generated data is to be written to the memory cell that requires the logic state of the memory cell to be changed; and
read means for sensing the logic state of the memory cell.

12. The memory cell of claim 11 wherein said write circuitry comprises first and second PN junctions each selectively disposed between an external reference supply and said first and second sense nodes, respectively, and means for connecting said external reference supply to the one of said PN junctions associated with the one of the sense nodes and associated SCRs to be changed from a saturated to a nonsaturated state by forward biasing said PN junction.

13. The memory cell of claim 12 wherein said first and second PN junctions comprise first and second Schottky diodes each having the anode thereof connected to the respective one of said first and second sense nodes.

14. A bipolar semiconductor memory utilizing ECL technology, comprising:
an array of memory cells arranged in rows and columns for storing first and second logic states;
a plurality of row lines, each associated with one of said rows of memory cells;
a current source associated with each row of memory cells for providing a holding current to each of said memory cells in said associated row;
a plurality of column lines associated with each of the columns, said column lines comprised of write column lines and read column lines;
each of said memory cells comprising:
first and second sense nodes,
first and second pairs of PNP and NPN transistors associated with said first and second sense nodes, respectively, and arranged in a cross-coupled configuration, each of said first and second pairs connected between said row lines and said associated current source and each of said first and second pairs alternating between a saturated state and a nonsaturated state corresponding to said first and second logic states,
write means for interfacing between said first and second sense nodes and said associated write column line to selectively provide a current path to said associated sense nodes to force said associated pair from the saturated state to the nonsaturated state to allow the logic state in said memory cell to be altered, and
read means for selectively interfacing the logic state stored in said first and second sense nodes with said read column lines;
address means for receiving and decoding an external address and generating a column select signal associated with select ones of said columns of memory cells and a row select signal associated with select ones of said rows of memory cells;
word line drive means for receiving said row select signal and selecting the corresponding one of said rows of memory cells through the associated one of said row lines;
read circuitry for sensing the logic state of the select memory cells interfaced with said selected read column lines corresponding to said select signals and outputting data therefrom; and
write circuitry for receiving input data and interfacing said received input data with said write column lines for the select column and row and controlling said write means in said selected memory cells to interface with an external supply through said write column lines to cause current flow to a select one of said first and second sense nodes through said current path to cause said associated first and second pairs to go from a saturated to an unsaturated state.

* * * * *